(12) United States Patent  
Miida

(10) Patent No.: US 6,768,093 B2  
(45) Date of Patent: Jul. 27, 2004

(54) SOLID STATE IMAGING DEVICE AND DRIVING METHOD THEREOF

(75) Inventor: Takashi Miida, Kanagawa (JP)

(73) Assignee: Innotech Corporation (JP)

( * ) Notice: Subject to any disclaimer, the term of this patent is extended or adjusted under 35 U.S.C. 154(b) by 120 days.

(21) Appl. No.: 10/238,638

(22) Filed: Sep. 11, 2002

(65) Prior Publication Data

US 2003/0010897 A1 Jan. 16, 2003

Related U.S. Application Data

(62) Division of application No. 09/750,791, filed on Jan. 2, 2001, now Pat. No. 6,476,371.

(30) Foreign Application Priority Data

Jan. 7, 2000 (JP) .......................................... 2000-1972  
Aug. 14, 2000 (JP) ...................................... 2000-245937

(51) Int. Cl.$^7$ ............................ H01J 40/14; H01L 31/62  
(52) U.S. Cl. ................................ 250/208.1; 250/214.1; 257/292; 348/302  
(58) Field of Search .......................... 250/208.1, 214.1, 250/214 R; 257/290, 291, 292, 431, 443, 444; 348/300, 301, 302, 308

(56) References Cited

U.S. PATENT DOCUMENTS

| 5,469,484 A | * | 11/1995 | Sato et al. ..................... 377/58 |
| 6,051,857 A | | 4/2000 | Miida .......................... 257/292 |
| 2002/0089594 A1 | * | 7/2002 | Ishimoto ....................... 348/296 |

FOREIGN PATENT DOCUMENTS

| JP | 11-26740 | 1/1999 |
| JP | 11-306784 | 11/1999 |

* cited by examiner

*Primary Examiner*—Kevin Pyo  
(74) *Attorney, Agent, or Firm*—Lorusso, Loud & Kelly

(57) ABSTRACT

Disclosed is a solid state imaging device, comprising a unit pixel 101 including a photo diode 111 and a MOS transistor 112 for optical signal detection provided with a high-density buried layer 25 for storing optically generated charges generated by light irradiation in the photo diode 111, a vertical scanning signal driving scanning circuit 102 for outputting a scanning signal to a gate electrode 19, and a voltage boost scanning circuit 108 for outputting a boosted voltage higher than a power source voltage to a source region 16. In this case, a boosted voltage is applied from the voltage boost scanning circuit 108 to the source region 16, and the optically generated charges stored in the high-density buried layer 25 are swept out from the high-density buried layer 25 by a source voltage and a gate voltage risen by the boosted voltage.

2 Claims, 11 Drawing Sheets

Applied Voltage Symbols

Applied Voltage Symbols

⊢ ···3.3V

⊩ ···2.0V

SOLID STATE IMAGING DEVICE AND DRIVING METHOD THEREOF

CROSS-REFERENCE TO RELATED APPLICATION

This application is a division of U.S. Ser. No. 09/750,791, filed Jan. 2, 2001, allowed now U.S. Patent No. 6,476,371.

BACKGROUND OF THE INVENTION

1. Field of the Invention

The present invention relates to a solid state imaging device and a driving method thereof. More particularly, the present invention relates to a solid state imaging device using a MOS (Metal-Oxide-Semiconductor) image sensor of a threshold voltage modulation system, the solid state imaging device being used for a video camera, an electronic camera, an image input camera, a scanner, a facsimile or the like, and relates to a driving method thereof.

2. Description of the Prior Art

Since a semiconductor image sensor such as a CCD (Charge Coupled Device) image sensor and a MOS image sensor is excellent in mass productivity, the semiconductor image sensor has been applied to almost all types of image input devices accompanied with the progress in a pattern micro fabrication technology.

Particularly, in recent years, the applicability of the MOS image sensor has been recognized again because of the advantages thereof, i.e., smaller power consumption compared with that of the CCD image sensor, and the capability of making a sensor element and a peripheral circuit element by the same CMOS (Complimentary Metal-Oxide-Semiconductor) technology.

In consideration of such a social trend, the present inventor has improved the MOS image sensor, and filed a patent application regarding a sensor element having a carrier pocket (high-density buried layer) under a channel region (Japanese Paten Application No. Hei 10-186453) to obtain a patent thereof (Registered Number 2935492).

In the invention according to the patent (Registered Number 2935492), a photo diode 111 and an insulated gate field effect transistor for optical signal detection (hereinafter, occasionally referred to as a MOS transistor for optical signal detection, or simply as a MOS transistor) are formed as placed adjacently to each other. The MOS transistor is provided with a ring-shaped carrier pocket in a well region under a channel region. The carrier pocket has a higher acceptor density than that of a peripheral portion thereof and serves as a potential well storing holes as carriers. In a state where the well region including the carrier pocket is depleted, holes are generated in the well region of the photo diode by light irradiation, followed by transferring the optically generated holes and storing in the potential well of the carrier pocket. As a result, negative charges of acceptor ions in the carrier pocket are neutralized and a threshold voltage is changed.

Further, the above-described MOS image sensor has a circuit constitution shown in FIG. 8 of the patent (Registered Number 2935492). A series of operations of the MOS image sensor are passed through an initializing period, a storing period and a reading-out period by a control signal supplied from the CMOS circuit. During the initializing period, optically generated holes remaining in a hole pocket 25 are discharged to the substrate 11 through applying a positive voltage to each electrode. During the storing period, optically generated holes are generated by light irradiation and then stored in the carrier pocket 25. Then, during the reading-out period, an optical signal proportional to the storage amount of the optically generated holes is detected.

However, the control signal supplied from the CMOS circuit is directed to the trend of lowering a voltage thereof, and this trend is contrary to a request of more perfectly performing the initialization by applying a high voltage during the initializing period.

SUMMARY OF THE INVENTION

The first object of the present invention is to provide a solid state imaging device, which is capable of being maintaining a low-voltage operation of a CMOS circuit and performing more perfectly an initializing operation, and a driving method thereof.

Incidentally, with such a constitution, in the case where an acceptor density or a pattern shape in the carrier pocket 25 is not even, as shown in FIG. 10A, the potential does not become even over the entire region of the carrier pocket 25, and variation in height of the potential, that is, variation in depth of the potential well partially occurs occasionally.

In such a case, as shown in FIG. 10C, with regard to injection of holes having a potential at a low level, the holes are partialized at a place where the potential well is deeper, and a potential in the channel region is varied corresponding to this deviation. For this reason, there are problems that modulation of the threshold voltage does not become even in the channel region, element current distribution does not reflect storing distribution of the hole to lose linearity to a volume of stored holes, thus a so-called black batter occurs.

The second object of the present invention is to provide a driving method of a solid state imaging device, which is capable of modulating evenly a threshold voltage over the entire channel region of an insulated gate field effect transistor for light detection.

The present invention is related to the solid state imaging device. As a basic constitution thereof, as shown in FIG. 3, it is characterized in that the solid state imaging device of the present invention comprises a unit pixel 101 including a photo diode 111 and a MOS transistor 112 for optical signal detection placed adjacently to the photo diode 111, in which a gate electrode of the MOS transistor 112 is connected to a vertical scanning signal (VSCAN) driving scanning circuit 102, and a source region is connected to a voltage boost scanning circuit 108. Further, it is characterized in that the drain region is connected to the drain voltage (VDD) driving scanning circuit 103 in addition to the foregoing constitution.

Moreover, in unit pixel 101, as shown in FIG. 1 and FIG. 2A, the photo diode 111 and the MOS transistor 112 are formed in well regions 15a and 15b connected to each other, and the unit pixel 101 comprises a high-density buried layer (carrier pocket) 25 for storing optically generated charges in the well region 15b in a peripheral portion of the source region 16 of the MOS transistor 112.

In a driving method of the present invention, a voltage boost scanning circuit 108 is connected to the source region 16 of the MOS transistor 112 for optical signal detection, and in an initializing period, a boosted voltage is applied to the source region 16 from the voltage boost scanning circuit 108 in the state that the vertical scanning signal (VSCAN) driving scanning circuit 102 is isolated from the gate electrode 19, or in addition to the isolation of the circuit 102, the drain voltage (VDD) driving scanning circuit 103 is isolated from the drain region 17a. Thus, a boosted voltage higher than a power supply voltage of the VSCAN driving scanning circuit 102 is applied further to a gate electrode 19 through a capacitor between the source region 16 and the gate electrode 19 from the voltage boost scanning circuit 108, in addition to a gate voltage having applied thereto during the storing period. In other words, since a high voltage is applied to the source region 16 and the gate electrode 19, a sweeping operation of the stored charges from the carrier pocket 25 can be performed more perfectly.

As described above, as the solid state imaging device of the present invention comprises the boosted voltage scanning circuit 108, the first object of more perfectly performing the sweeping operation while maintaining to lower the outer supply voltage is attained.

Moreover, the present invention is related to a driving method of the solid state imaging device. As shown in FIG. 8, a voltage is applied to the gate electrode 19 of the insulated gate field effect transistor 112 for optical signal detection so that most of the optically generated charges stored in the carrier pocket 25 are discharged from the carrier pocket 25 during the initializing period and a specified amount thereof is made to remain in the carrier pocket 25.

In other words, the present invention, particularly as shown by a solid line of FIG. 9B, an appropriate voltage is applied to the source region 16 and the gate electrode 19 to make shallow the potential well of the carrier pocket 25, but to set the same in an appropriate depth, to discharge most of the optically generated charges and to let only a specified amount of the optically generated charges remain therein. The specified amount means the amount such that a potential distribution is flattened over the entire region of the carrier pocket 25. FIG. 10B, at this time, shows a model of a distribution of the optically generated charges over the entire region of the carrier pocket 25, and of the potential distribution thereover. In the case where the optically generated charges are stored further from such a state, the optically generated charges are stored without being deviated. Therefore, a modulation of the threshold voltage becomes even.

As described above, in a driving method of the solid state imaging device according to the present invention, such specified amount of the optically generated charges that the potential distribution is flattened over the entire region of the carrier pocket 25 is remained in the carrier pocket 25. Therefore, the second object that the modulation of the threshold voltage becomes even over the entire channel region of the MOS transistor in the storing period can be attained.

Note that, in the case where the well regions and the like are a conductive type reverse to the foregoing, that is, in the case where the high-density layer is an n-type, the high-density buried layer becomes an electron pocket (carrier pocket), and the optically generated electrons are stored. In this case, a negative large voltage is applied to the gate electrode to lower a potential of the surface of the well region 15b, and a potential well of the carrier pocket 25 is made shallow to discharge the optically generated electrons from the carrier pocket 25.

BRIEF DESCRIPTION OF THE DRAWINGS

For a more complete understanding of the present invention and the advantages thereof, reference is now made to the following description taken in conjunction with the accompanying drawings.

DESCRIPTION OF THE PREFERRED EMBODIMENTS (First embodiment)

Now, a first embodiment of the present invention will be described with reference to the accompanying drawings.

Figure 1:
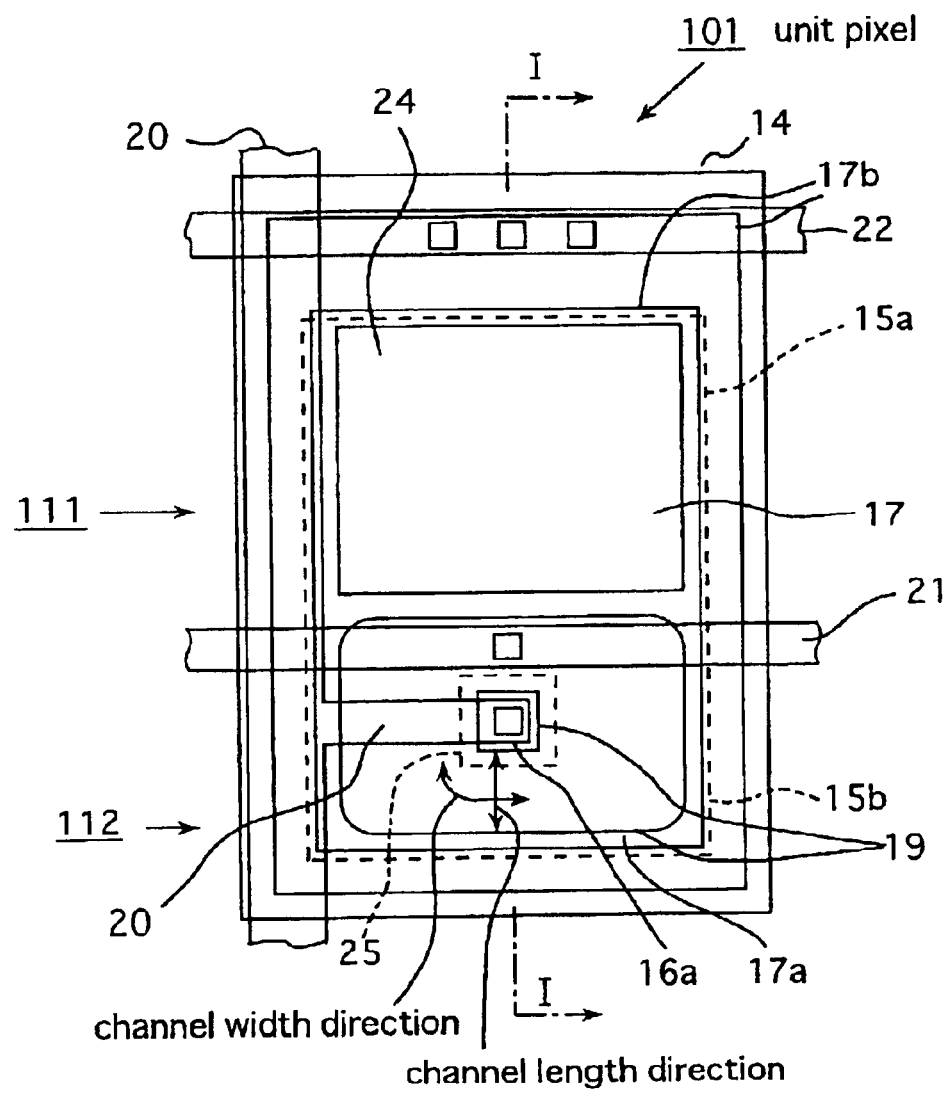
FIG. 1 is a plan view showing an element layout in a unit pixel of a solid state imaging device according to first embodiments of the present invention.

FIG. 1 is a plan view showing an element layout in a unit pixel of a MOS image sensor including the voltage boost scanning circuit according to the first embodiment of the present invention.

As shown in FIG. 1, in a unit pixel 101, a photo diode 111 and an insulated gate field effect transistor for optical signal detection (hereinafter, referred to as a MOS transistor 112 for optical signal detection, or simply as a MOS transistor 112) are provided adjacent to each other. For the MOS transistor 112, a depletion type n-channel MOS (n MOS) is employed.

The photo diode 111 and the MOS transistor 112 are formed in different well regions respectively, i.e., first and second well regions 15a and 15b, which are connected to each other to be integrally formed with each other. The first well region 15a in the photo diode 111 constitutes a part of the region that generates charges by light irradiation. The second well region 15b in the MOS transistor 112 constitutes a gate region capable of changing a channel threshold voltage by a potential of the well region 15b.

The MOS transistor 112 has a lightly doped drain (LDD) structure. Drain regions 17a and 17b are formed so as to surround the outer peripheral portion of a ring-shaped gate electrode 19, while a source region 16 is formed so as to be surrounded with the inner periphery of the ring-shaped gate electrode 19.

The lightly doped drain region 17a is extended to form an impurity region 17 of the photo diode 111, which has an impurity density substantially equal to that of the lightly doped drain region 17. In other words, the impurity region 17 and the lightly doped drain region 17a are integrally formed with each other such that most regions thereof can be placed in contact with surface layers of the first and second well regions 15a and 15b. In the outer peripheral portion of the impurity region 17a and the lightly doped drain region 17a, the high-density drain region 17b is formed as a contact layer so as to be connected to the lightly doped drain region 17a while being kept away from a photodetection portion.

In addition, a carrier pocket (high-density buried layer) 25 as a feature of the MOS image sensor is formed in the peripheral portion of the source region 16 within the second well region 15b below the gate electrode 19 in such a way as to surround the source region 16.

The drain regions 17a and 17b are connected through the contact layer 17b of low resistance to a drain voltage (VDD) supply line (or a drain electrode) 22; the gate electrode 19 to a vertical scanning signal (VSCAN) supply line 21; and the source region 16 to a vertical output line (or a source electrode) 20.

The light receiving window 24 is provided in the photo diode 111.

Next, description will be made for a cross-sectional structure of the unit cell of the foregoing MOS image sensor.

Figure 2A:
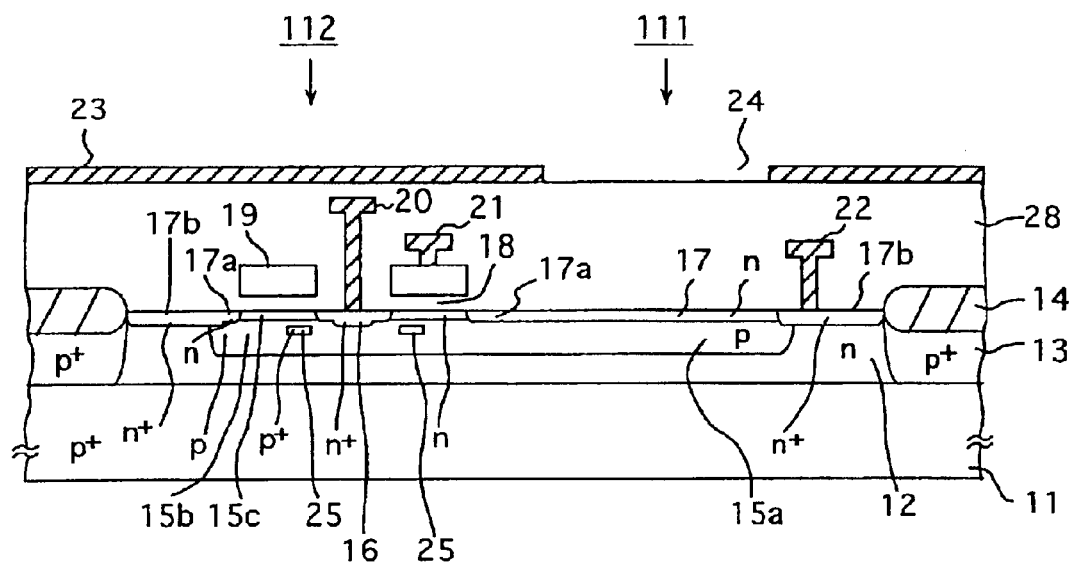
FIG. 2A is a cross-sectional view along a line I—I of FIG. 1, showing a cross-sectional structure of a unit pixel for the same.

FIG. 2A is a cross-sectional view along a line I—I of FIG. 1.

As shown in FIG. 2A, n-type (second conductivity type) silicon having an impurity density set at about $1 \times 10^{15}$ cm$^{-3}$ is epitaxially grown on a substrate (first semiconductor layer) 11 made of p-type (first conductivity type) silicon having an impurity density set at $1 \times 10^{18}$ cm$^{-3}$ or higher, and thereby an epitaxial layer (second semiconductor layer) 12 is formed.

In this epitaxial layer 12, a plurality of pixels 101, each including the photo diode 111 and the MOS transistor 112 for optical signal detection, are formed.

The foregoing entire components are covered with an insulating film 28, and the regions other than the light receiving window 24 of the photo diode 111 are shielded from lights by a metal layer (light shielding film 23 on the insulating film 28.

Next, the photo diode 111 will be described in detail by referring to FIG. 2A.

The photo diode 111 includes: the epitaxial layer 12; the p-type first well region 15a formed on the surface layer of the epitaxial layer 12; and the n-type impurity region 17 extended from the surface layer of the first well region 15a to the surface layer of the epitaxial layer 12. The p-type substrate 11 constitutes a first semiconductor layer of a first conductivity type of the photo diode 111. Likewise, the n-type epitaxial layer 12 constitutes a second semiconductor layer of a second conductivity type.

The impurity region 17 is formed so as to be extended from the lightly doped drain region 17a of the MOS transistor 112 for optical signal detection. The impurity region 17 has an impurity density substantially equal to that of the lightly doped drain region 17a.

In the storing period, the impurity region 17 is connected to the drain voltage supply line 22, and biased at a positive potential. At this time, a depletion layer spreads from a boundary surface between the impurity region 17 and the first well region 15a to the entire first well region 15a, and then reaches the n-type epitaxial layer 12. On the other hand, a depletion layer spreads from a boundary surface between the substrate 11 and the epitaxial layer 12 to the epitaxial layer 12, and then reaches the first well region 15a.

In the first well region 15a and the epitaxial layer 12, a potential distribution is set in such a manner that a potential is gradually reduced from the substrate 11 side to the surface side. Accordingly, holes generated by lights in the first well region 15a and the epitaxial layer 12 remain therein without flowing out to the substrate 11 side. Since the first well region 15a and the epitaxial layer 12 are connected to the gate region 15b of the MOS transistor 112, the holes generated by lights can be effectively utilized as charges for modulation of the threshold voltage of the MOS transistor 112. In other words, the first well region 15a and the epitaxial layer 12 entirely become carrier generating regions by lights.

Moreover, the carrier generating regions by lights are disposed under the impurity region 17 in the foregoing photo diode 111, which means that the photo diode 111 has a buried structure for holes generated by lights. Accordingly, it is possible to reduce a noise without being affected by the semiconductor layer surface of many trap states.

Next, the MOS transistor 112 for optical signal detection will be described in detail by referring to FIG. 2A.

The MOS transistor 112 portion includes the following elements sequentially from the lower side: a p-type substrate 11; an n-type epitaxial layer 12 formed on the substrate 11; and a second p-type well region 15b formed in the epitaxial layer 12. The p-type substrate 11 constitutes a first semiconductor layer of an opposite conductivity type of the MOS transistor 112 portion; and likewise, the epitaxial layer 12 constitutes a second semiconductor layer of one conductivity type of the MOS transistor 112 portion.

The MOS transistor 112 is structured in such a way as to surround the outer periphery of the ring-shaped gate electrode 19 with the n-type lightly doped drain region 17a. The n-type lightly doped drain region 17a is formed integrally with the n-type impurity region 17. In the outer peripheral portion of the impurity region 17 extended from the lightly doped drain region 17a, a high-density drain region 17b is formed so as to be connected to the impurity region 17 and to be extended to the element isolation region 13 and the element isolation insulating film 14. The high-density drain region 17b becomes a contact layer for the drain electrode 22.

In addition, an n-type source region 16 is formed so as to be surrounded with the ring-shaped gate electrode 19. For the source region 16, a center portion thereof is at a high density, and a peripheral portion thereof is at a low density. A source electrode 20 is connected to the source region 16.

The gate electrode 19 is formed above the channel region between the drain region 17a and the source region 16 by interpolating a gate insulating film 18. The surface layer of the second well region 15b below the gate electrode 19 becomes a channel region. Further, in order to maintain the channel region in an inversion or depletion state at a usual operation voltage, n-type impurities of a proper density are introduced to the channel region to form a channel doped layer 15c.

A p+-type high-density buried layer (carrier pocket) 25 is formed in a part of the region in the channel longitudinal direction in the second well region 15b below the channel region so as to surround the source region 16. This p+-type high-density buried layer 25 can be formed by means of, for example, ion implantation. Preferably, the high-density buried layer 25 should be formed so as not to be in contact with the channel region.

In the p+-type high-density buried layer 25, a potential thereof is lower than the potential in the peripheral portion of the high-density buried layer 25 for optically generated holes among optically generated charges. Accordingly, the optically generated holes can be collected in the carrier pocket 25. The collection of the optically generated holes to the carrier pocket 25 is accelerated when voltages higher than a gate voltage are applied to the drain regions 17a and 17b.

Figure 2B:
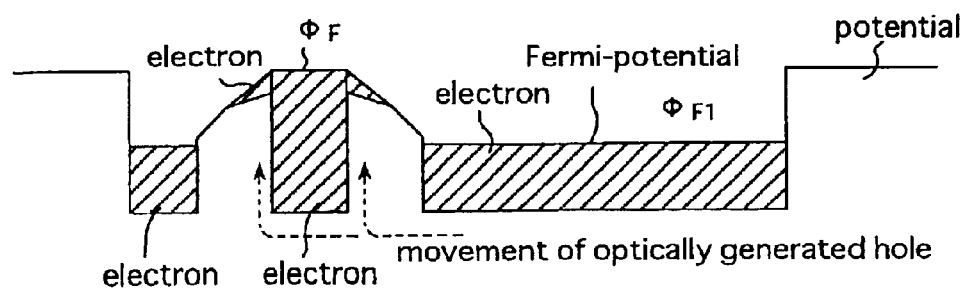
FIG. 2B is a view showing a condition of a potential in a state where optically generated holes are stored in a carrier pocket and electrons are induced in a channel region to generate an electron-accumulating region.

FIG. 2B shows a state of a potential where optically generated holes are stored in the carrier pocket 25 and electrons are induced in the channel region to form an electron-accumulating region. Such stored charges in the carrier pocket 25 cause a change in the threshold voltage of the MOS transistor 112. Thus, optical signal detection can be carried out by detecting this change of the threshold voltage.

In the initializing period, a high voltage is applied to the source region 16 and the gate electrode 19 and, by using an electric field thereby generated, carriers remaining in the second well region 15b are swept out to the substrate 11 side. In this case, the applied voltage causes a depletion layer to spread from a boundary surface between the channel doped layer 15c of the channel region and the second well region 15b to the second well region 15b, and causes a depletion layer to spread from a boundary surface between the p-type substrate 11 and the epitaxial layer 12 to the epitaxial layer 12 below the second well region 15b.

Thus, the application range of an electric field generated by the voltage applied to the source region 16 and the gate electrode 19 mainly includes the second well region 15b and the epitaxial layer 12 below the same.

Figure 3:
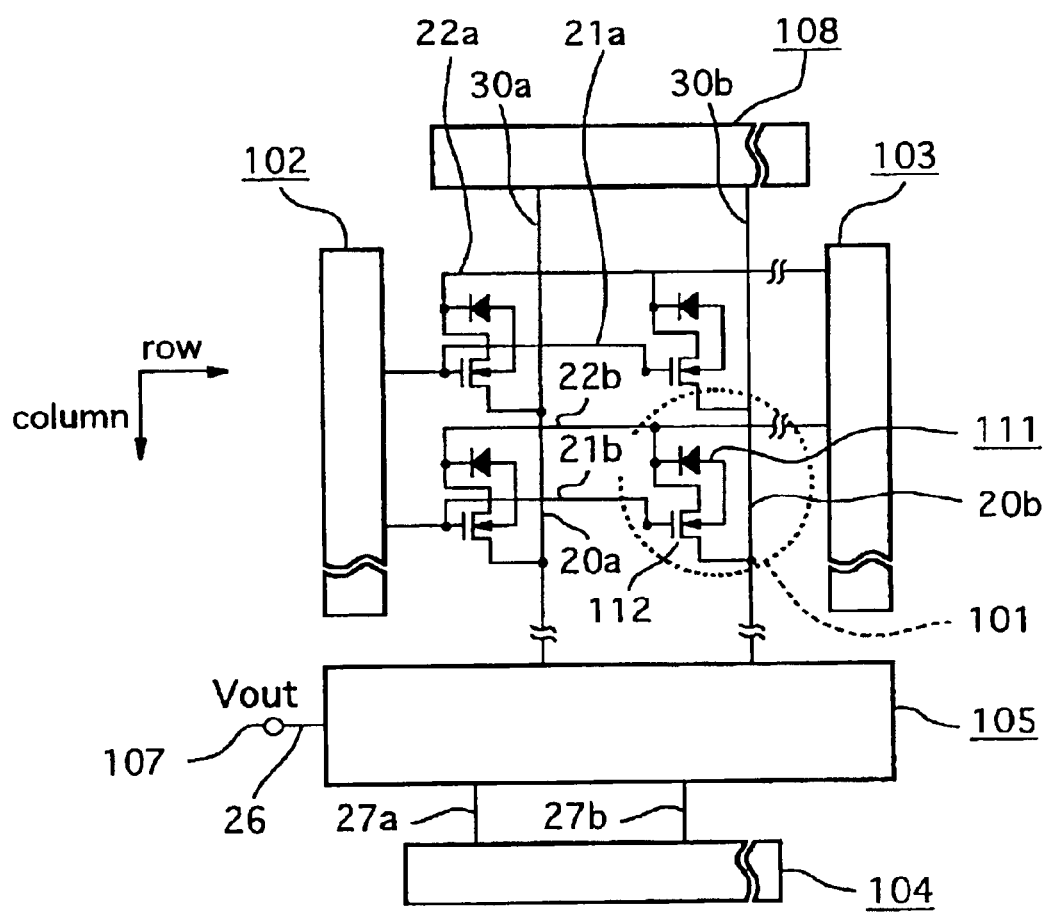
FIG. 3 is a view showing a circuit constitution of the entire solid state imaging device according to the first embodiment of the present invention.

Next, description will be made for the entire constitution of the MOS image sensor employing the unit pixel structured in the foregoing manner by referring to FIG. 3. FIG. 3 shows a circuit constitution of the MOS image sensor according to the first embodiment of the present invention.

As shown in FIG. 3, this MOS image sensor employs the constitution of a two-dimensional array sensor, and the unit pixels 101 of the foregoing structure are arrayed in the row and column directions in a matrix shape.

A driving scanning circuit 102 for a vertical scanning signal (hereinafter, referred to as a VSCAN driving scanning circuit) and a driving scanning circuit 103 for a drain voltage (VDD) (hereinafter, referred to as a VDD driving scanning circuit) are arranged right and left sandwiching a pixel region.

Vertical scanning signal supply lines (hereinafter, referred to as a VSCAN supply lines) 21a and 21b are drawn out, one for each row, from the VSCAN driving scanning circuit 102. The VSCAN supply lines 21a and 21b are connected to the gate of the MOS transistor 112 in each of all the pixels 101 arrayed in the row direction.

Drain voltage supply lines (hereinafter, referred to as a VDD supply lines) 22a and 22b are drawn out, one for each row, from the VDD driving scanning circuit 103. Each of the VDD supply lines 22a and 22b are respectively connected to the drain electrode 22 of the MOS transistor 112 for optical signal detection in each of all the pixels 101 arrayed in the row direction.

Vertical output lines 20a and 20b different for each column are provided. These vertical output lines 20a and 20b are respectively connected to the source electrode 20 of the MOS transistor 112 in each of all the unit pixels 101 arrayed in the column direction.

Moreover, the source electrode 20 of the MOS transistor 112 is connected, for each column, to a signal output circuit 105 through the vertical output lines 20a and 20b.

Based on the vertical scanning signal (VSCAN) and horizontal scanning signal (HSCAN), the MOS transistors 112 of the respective unit pixels 101 are sequentially driven to read-out a video signal (Vout), which is proportional to a light incident amount and does not contain a noise component due to the remaining charges from a signal output circuit 105.

Figure 4A:
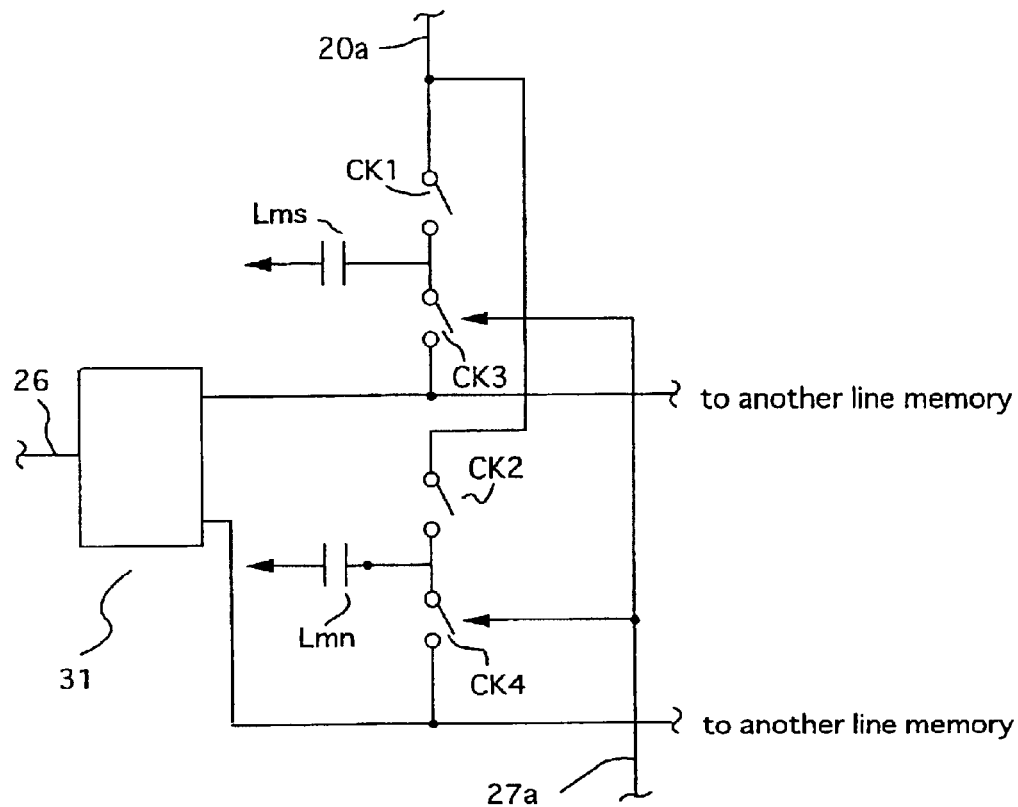
FIG. 4A and FIG. 4B are circuit views showing detailed constitutions of signal output circuits of the solid state imaging device of FIG. 3, respectively.
Figure 4B:
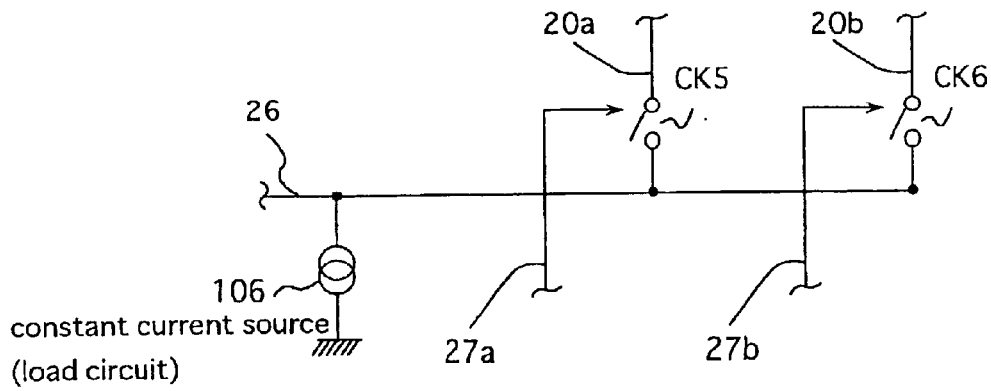

FIGS. 4A and 4B show the signal output circuit 105 in detail.

In FIG. 4A, the source region is directly connected to a line memory composed of an input capacitance in the above-described signal output circuit 105. The source region is characterized in that an active load such as a constant current source is not connected thereto.

As shown in FIG. 4A, a first line memory Lms connected to the source electrode 20 of the MOS transistor 112 for optical signal detection through a first switch CK1 stores a source potential containing an optical signal voltage and a noise voltage due to the remaining charges before the storing of the optically generated charges. Likewise, a second line memory Lmn connected to the source electrode 20 through a second switch CK2 stores a source potential containing only the noise voltage. And, the stored source potentials are inputted to an operational amplifier circuit 31 through a third switch CK3 and a fourth switch CK4, respectively. Then, an optical signal voltage as a difference voltage is outputted to a video signal output terminal 107 through the horizontal output line 26. The operational amplifier circuit 31 is constituted such that a switched capacitance circuit is constituted in combination with the memory capacitances Lms and Lmn.

FIG. 4B is a circuit view showing another example of the signal output circuit 105. In FIG. 4A, the line memories Lms and Lmn composed of the input capacitances are directly connected to the source region 16 in the signal output circuit 105. However, as shown in FIG. 4B, a constant current source (load circuit) 106 may be connected to the line memories in parallel to establish a source follower connection.

The switches (CK1 to CK6) in the above-described signal output circuit 105 are schematically shown as in FIG. 4 in order to indicate that they connect and cut off the wiring paths corresponding thereto. However, the MOS transistor is used in single or in combination thereof such that the circuit operation described in the second embodiment can be appropriately performed.

Moreover, as shown in FIG. 3, a voltage boost scanning circuit 108 is provided in the solid state imaging device of this embodiment. Boosted voltage output lines 30a and 30b from the voltage boost scanning circuit 108 are connected to the vertical output lines 20a and 20b, respectively. In other words, a boosted voltage is applied to the source region of the MOS transistor 112 of each pixel 101 for each column. The boosted voltage is applied resultantly to the gate through a capacitance between the gate and the source. Therefore, an electric field strength applied to the well region 15*b* is increased, thus enabling sweeping out of the carriers to perform more perfectly.

Figure 5:
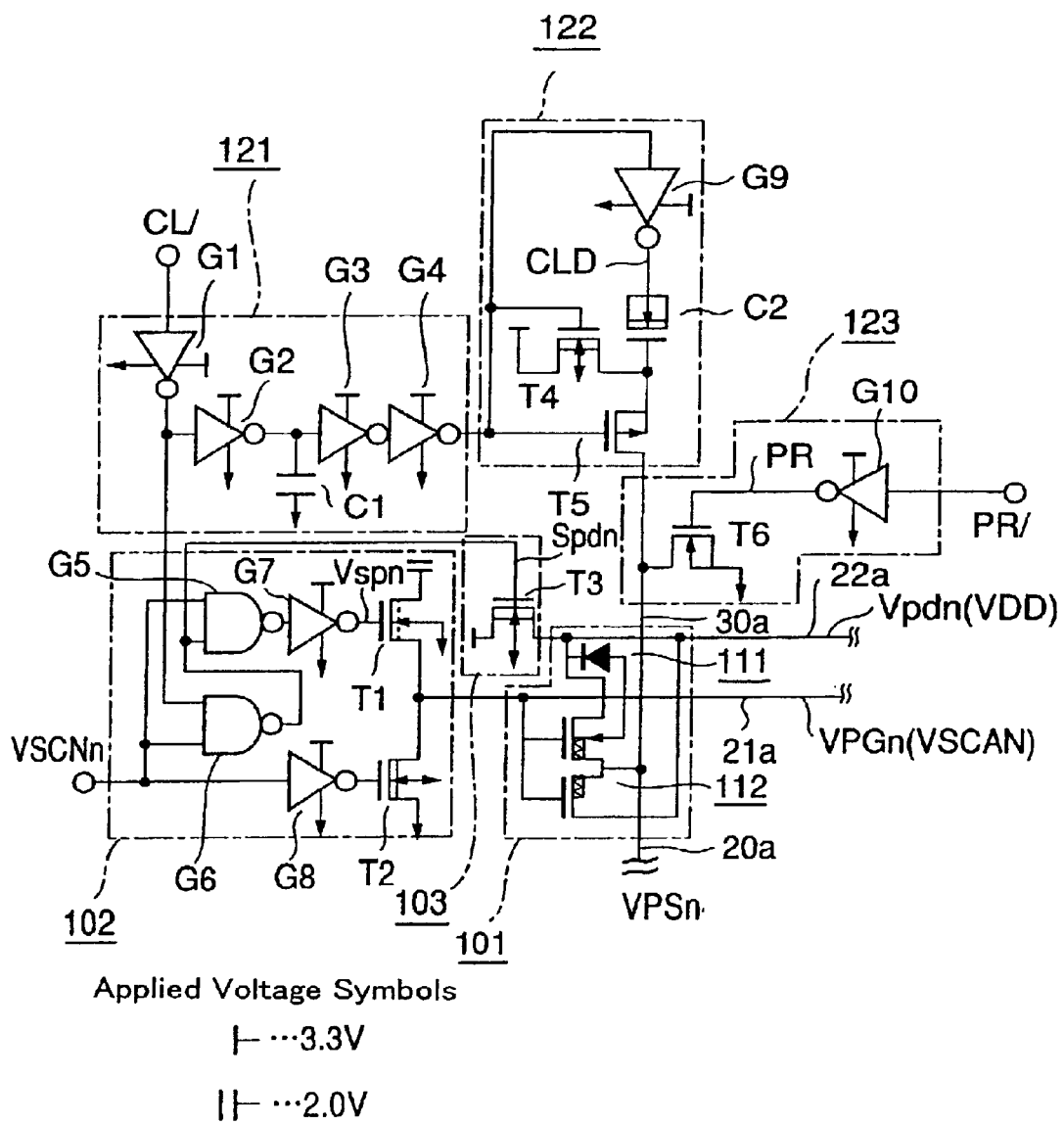
FIG. 5 is a circuit view showing a detail of a drive circuit including the voltage boost scanning circuit of the solid state imaging device of FIG. 3.

FIG. 5 is a circuit view showing a detail of the driving circuit including the voltage boost scanning circuit 108 shown in FIG. 3.

As shown In FIG. 5, the voltage boost scanning circuit 108 includes a clock generating circuit 121, a voltage boost circuit 122 and a precharge circuit 123.

In the clock generating circuit 121, inverters G1 to G4 are connected to a clock input terminal (CL/) in series. The output terminal of the inverter G4 serves as an output of the clock generating circuit 121 and is connected to an input of the voltage boost circuit 122.

The output terminal of the inverter G1 is connected to an input terminal of the inverter G2 at a one end, and to the VSCAN driving scanning circuit 102 as inverting output of the clock generating circuit 121 at the another end. Moreover, a capacitance C1 for delaying a clock pulse is connected in parallel between the inverters G2 and G3.

A clock inputted from the clock input terminal (CL/) is amplified by the inverters G1 to G4 and outputted from an output end of the clock generating circuit 121 and inputted to the voltage boost circuit 122 while keeping an original polarity thereof without being inverted.

In the voltage boost circuit 122, an input end thereof is divided into three directions.

First end is connected to one end of a capacitance C2 generating a boosted voltage through the inverter G9. An another end of the capacitance C2 is connected to the boosted voltage output line 30*a* connected to the vertical output line 20*a*.

Second end is connected to a gate of a transistor T4 controlling a supply of a voltage 3.3 V to the another end of the capacitance C2. A drain of the transistor T4 is connected to a voltage supply of 3.3 V, and a source thereof which serves as output is connected to the another end of the capacitance C2.

Third end is connected to a gate of a transistor T5 controlling a connection between the another end of the capacitance C2 and the boosted voltage output line 30*a*. The connection is communicated or cut off through on or off of transistor T5.

A potential at the output end of the inverter G9 is represented as CLD. A potential of the vertical output line 20*a* and the boosted voltage output line 30*a* is represented as VPSn.

When High level (hereinafter, referred to as H) of a clock pulse is inputted to the clock input terminal (CL/), the transistor T4 is turned on to charge a voltage of 3.3 V through the transistor T4 to the capacitance C2. Moreover, a voltage of 3.3 V is outputted through the transistor T5 to the boosted voltage output line 30*a*. When Low level (hereinafter, referred to as L) of the clock pulse is inputted thereto, a voltage of the inverter G9 side of the capacitance C2 is elevated to a voltage of 3.3 V through the inverter G9. At this time, in the case where another voltage of 3.3 V is charged to the capacitance C2 immediately before L of the clock pulse is inputted, a voltage at an opposite side of the capacitance C2 is elevated to 6.6 V. When L of the clock pulse is inputted to the clock input terminal (CL/), the transistor T5 is turned on to conduct a voltage 6.6 V at the opposite side of the capacitance C2 to the boosted voltage output line 30*a*.

In the precharge circuit 123, an inverter G10 is connected to an input end (PR/), and a gate of a transistor T6 which controls an application of a ground potential to the boosted voltage output line 30*a* is connected to an output end of the inverter G10. The potential of the output end of the inverter G10 is represented as PR. The drain of the transistor T6 is grounded. The source of the transistor T6, which is an output end of the precharge circuit 123, is connected to the boosted voltage output line 30*a*.

When the H is inputted to the input end (PR/) of the precharge circuit 123, the transistor T6 is turned off. When the L is inputted thereto, the transistor T6 is turned on. Thus, a ground potential is outputted to the boosted voltage output line 30*a* when the input end (PR/) is the L.

Next, as referring to FIG. 5 sequently, description will be made in detail for a circuit example of the VSCAN driving scanning circuit 102 and the VDD driving scanning circuit 103. The VSCAN driving scanning circuit 102 and the VDD driving scanning circuit 103 hold an input end in common. From the input end, the same scanning signal (VSCNn) is inputted.

First, the VSCAN driving scanning circuit 102 will be described in detail below. The input end is divided into two lines through which control voltages are supplied to the transistors T1 and T2 controlling a supply of a control voltage to the VSCAN supply line 21*a*, respectively. One end thereof is connected to an input end of the inverter G8, and an output end of the inverter G8 is connected to a gate of the transistor T2.

The other end is further divided to connect respectively to one of two input ends of the inverter G5 and one of two input ends of the inverter G6. The output end of the inverter G6 is divided. The divided one is connected to the other input end of the inverter G5, and the other is connected to the gate of the transistor T3 of the VDD driving scanning circuit 103. A potential at the gate of the transistor T3 is represented as Spdn.

The output end of the inverter G5 is connected to the input end of the inverter G7. The output end of the inverter G7 is connected to the gate of the transistor T1. A potential of the output end of the inverter G7 is represented as Vspn.

The source of the transistor T1 is connected to a power supply of 2 V, and the source of the transistor T2 is grounded. The drains of the transistors T1 and T2 are connected to become the one output end of the VSCAN driving scanning circuit 102 and are connected to the VSCAN supply line 21*a*. A potential of the VSCAN supply line 21*a* is represented as VPGn (VSCAN). During the storing period, for the transistors T1 and T2, when the transistor T1 is turned off, the transistor T2 is turned on and a ground potential appears at the output end. During the reading-out period, when the transistor T1 is turned on, the transistor T2 is turned off, and a voltage of about 2 V appears at the output end. And during the initializing period, both the transistors T1 and T2 are turned off, the VSCAN supply line 21*a* is cut off from the VSCAN driving scanning circuit 102, and then the gate potential of the MOS transistor 112 appears on the VSCAN supply line 21*a*.

In the VDD driving scanning circuit 103, the transistor T3 is provided and controls an application of 3.3 V to the VDD supply line 22*a*. The gate of the transistor T3 is connected to the output end of the inverter G6, the drain thereof is connected to the power source of 3.3 V, and the source thereof as the output end of the transistor T3 is connected to the VDD supply line 22*a*. The VDD supply line 22*a* is connected to the drain of the MOS transistor 112 in the pixel 101. A potential of the VDD supply line 22*a* is represented as Vpdn (VDD).

The foregoing various scanning circuits 102, 103, 104, 108 and signal output circuit 105 etc. have circuit constitutions mainly comprising CMOS transistors.

Next, description will be simply made for the element operation of the MOS image sensor for optical signal detection.

In the element operation, a series of periods including sweeping (initializing), storing, and reading-out are repeated, for example in the order of sweeping (initializing) period-storing period-reading-out period-sweeping (initializing) period . . . .

In the sweeping period (initializing), prior to storage of optically generated charges, optically generated charges that remain after reading-out, acceptors, donors and the like are neutralized, and alternatively residual charges such as holes, electrons and the like that are trapped in a surface level before optical signal reading-out are discharged out of a semiconductor, thereby the carrier pocket 25 is vacated. In this case, the voltage boost scanning circuit 108 boosts a low control voltage outputted from the CMOS circuit into about two or three times the control voltage and outputs positive high voltages of about +5 V or higher, usually 7 to 8 V. This boosted voltage is applied to the source region 16 and the gate electrode 19.

In the storing period, carriers (optically generated charges) are generated by light irradiation, and holes among the carriers are moved in the first and second well regions 15a and 15b and then stored in the carrier pocket 25. Positive voltages of about +2 to 3 V are applied to the drain regions 17a and 17b, and a low positive or negative voltage is applied to the gate electrode 19 to enable the MOS transistor 112 to maintain a cut-off state.

In the reading-out period, a change in the threshold voltage of the MOS transistor 112 caused by the optically generated charges stored in the carrier pocket 25 is read-out as a change of a source potential. In order to operate the MOS transistor 112 in a saturated state, positive voltages of about +2 to 3 V are applied to the drain regions 17a and 17b, and a positive voltage of about +2 to 3 V is applied to the gate electrode 19.

As described above, according to the first embodiment of the present invention, the solid state imaging device has the voltage boost scanning circuit 108 connected to the source electrode 20, and the voltage boost scanning circuit 108 boosts a low control voltage outputted from the CMOS circuit into about two or three times of the control voltage and outputs it therefrom. Thus, it is capable of applying a high voltage to the gate electrode 19 through the source region 16. Therefore, it is capable of maintaining to lower the operation voltage of the CMOS circuit while the initialization is more perfectly performed.

The first embodiment of the present invention has been described in detail. However, the scope of the present invention is not limited to the specific examples in the second embodiment, and changes and modifications of the embodiment without departing from the spirit of the present invention are within the scope of the present invention.

For example, in the first embodiment, although the voltage boost scanning circuit 108 as shown in FIG. 5 is used, the scope is not limited to this. It may have a function such that a low control voltage outputted from a CMOS circuit can be boosted into two or three times the control voltage.

Moreover, the first and second well regions 15a and 15b are formed in the n-type epitaxial layer 12 on the p-type substrate 11. However, instead of the n-type epitaxial layer 12, n-type impurities may be introduced to a p-type epitaxial layer to form an n-type well layer, and the first and second well regions 15a and 15b may be formed in this n-type well region.

Furthermore, various variation examples can be conceived as structures of the solid state imaging device to which the present invention is applied. However other structures may be, it is sufficient that the photo diode and the MOS transistor for optical signal detection may constitute the unit pixel being adjacent to each other, and that the high-density buried layer (carrier pocket) may be provided in the vicinity of the source region within the p-type well region under the channel region of the MOS transistor.

Still further, the p-type substrate 11 is used, but instead, an n-type substrate may be used. In this case, in order to obtain an effect similar to that of the above-described second embodiment, it is sufficient that the conductivity types of the entire layers and regions that have been described in the second embodiment may be reversed. In this case, carriers to be stored in the carrier pocket 25 are electrons between electrons and holes.

(Second embodiment)

Next, as referring to FIG. 3 to FIG. 6, description will be made for a series of successive operation of a photo signal detection including an initializing operation according to the first embodiment. The solid state imaging device according to the first embodiment is used for an application to the operation of the photo signal detection, and the signal output circuit 105 as shown in FIG. 4 is used. As descriptions for FIG. 3 to FIG. 5 have already been performed, they are omitted.

Figure 6:
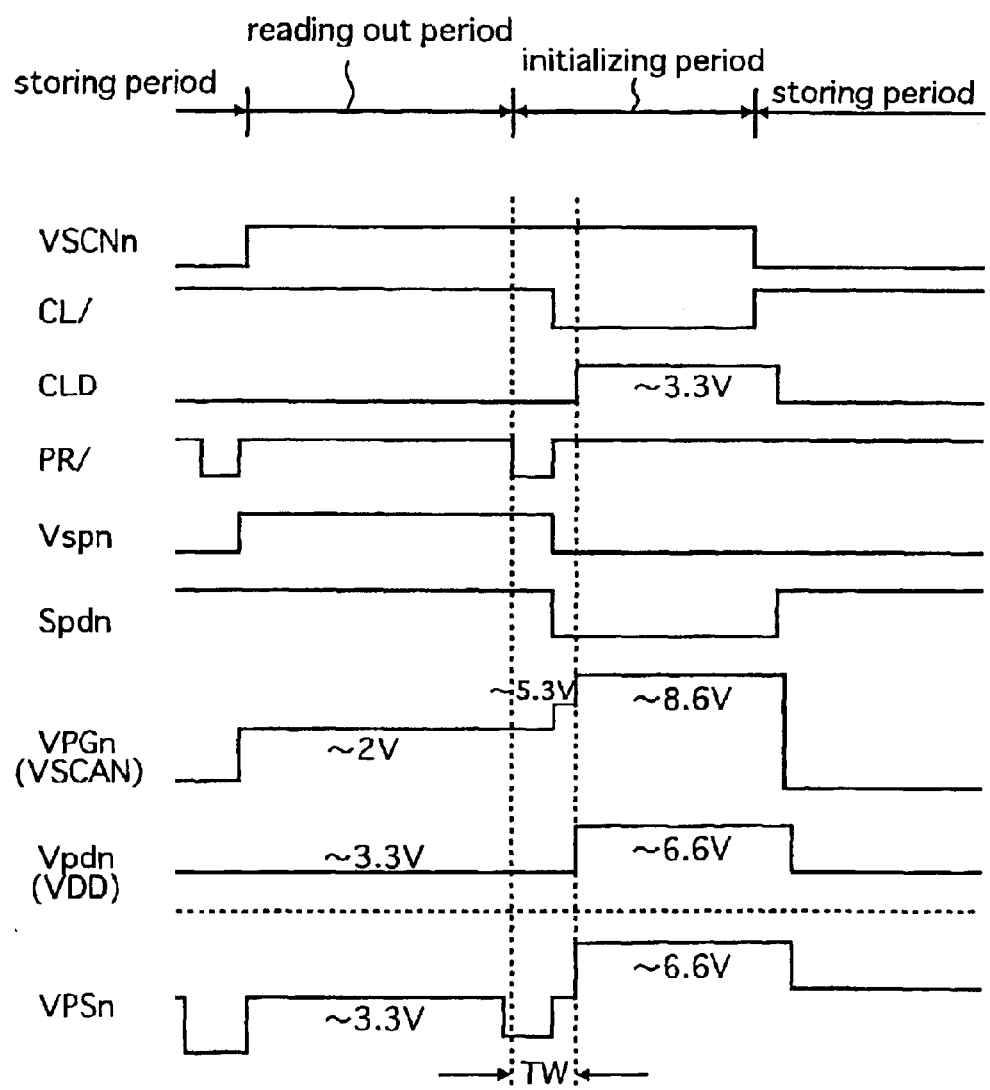
FIG. 6 is a timing chart showing a driving method of a solid state imaging device according to the second embodiment of the present invention.

FIG. 6 is a timing chart showing a series of successive operation of a photo signal detection including an initializing operation according to the second embodiment.

The photodetecting operation is carried out by repeating, as described above, a series of periods including sweeping (initializing), storing and reading-out. Herein, for a convenience, description will be made from the storing period.

First, during the storing period, a low gate voltage is applied to the gate electrode 19 of the MOS transistor 112, and a voltage (VDD) of about 2 to 3 V is applied to the drain regions 17a and 17b. At this time, the first and second well regions 15a and 15b and the epitaxial layer 12 are depleted. Then, an electric field from the drain regions 17a and 17b to the source region 16 is generated.

Subsequently, when the photo diode 111 is irradiated with a light, hole-electron pairs (optically generated charges) are generated.

The foregoing electric field causes optically generated holes among the optically generated charges to be injected into the gate region 15b of the MOS transistor 112 for optical signal detection, and to start being stored in the carrier pocket 25.

During the storing period immediately before the reading-out period, L of a clock pulse is inputted to the input end (PR/) of the precharge circuit 123, the output end a source of the MOS transistor 112 is driven at a ground potential. At this time, L of a clock pulse (VSCNn) is inputted to the input end of the VSCAN driving scanning circuit 102, and the output of the VSCAN driving scanning circuit 102 is set at a ground potential to drive a gate of the MOS transistor 112. The output (Vpdn) of the VDD driving scanning circuit 103 is about 3.3 V. In other words, the optically generated holes are accelerated in the transfer to the carrier pocket 25 and are more perfectly stored in the carrier pocket 25 through the lowering of the potential of the source region 16 and the gate electrode 19.

A limitation is placed on the width of the depletion layer spread from the channel region to the gate region 15b therebelow, a potential near the source region 16 is modulated, and the threshold voltage of the MOS transistor 112 is changed.

Next, during the reading-out period, H of the clock pulse (VSCNn) is inputted to the input end of the VSCAN driving scanning circuit 102. Thus, the output (VPGn) of the VSCAN driving scanning circuit 102 is set at about 2 V to drive a gate of the MOS transistor 112. At the same time, H of the clock pulse is inputted to the input end (PR/) of the precharge circuit 123 to turn the transistor T6 off. Thus, the source electrode 20 of the MOS transistor 112 is cut off from the precharge circuit 123. On the other hand, a voltage of the VDD driving scanning line 22a is maintained at about 3.3 V.

In other words, a gate voltage of about 2 V is applied to the gate electrode 19 and voltages VDD of about 3 V are applied to the drain regions 17a and 17b to enable the MOS transistor 112 to operate in a saturated state. Thus, an inversion region of a low electric field is formed in a part of the channel region above the carrier pocket 25, and a high electric field region is formed in a remaining portion thereof.

Furthermore, the constant current source 106 of the signal output circuit 105 is connected to the source region 16 of the MOS transistor 112. Accordingly, the MOS transistor 112 constitutes a source follower circuit. Thus, a source potential is changed following fluctuation in the threshold voltage of the MOS transistor 112, which is caused by optically generated holes, and an output voltage is changed.

In this way, a video signal (Vout) proportional to the amount of light irradiation can be taken out.

Next, an initializing operation will be described. In the initializing operation, charges remaining in the carrier pocket 25 and the first and second well regions 15a and 15b are discharged.

First of all, the initializing period (T period) immediately after the reading-out period will be described with reference to the timing chart of FIG. 7.

Figure 7:
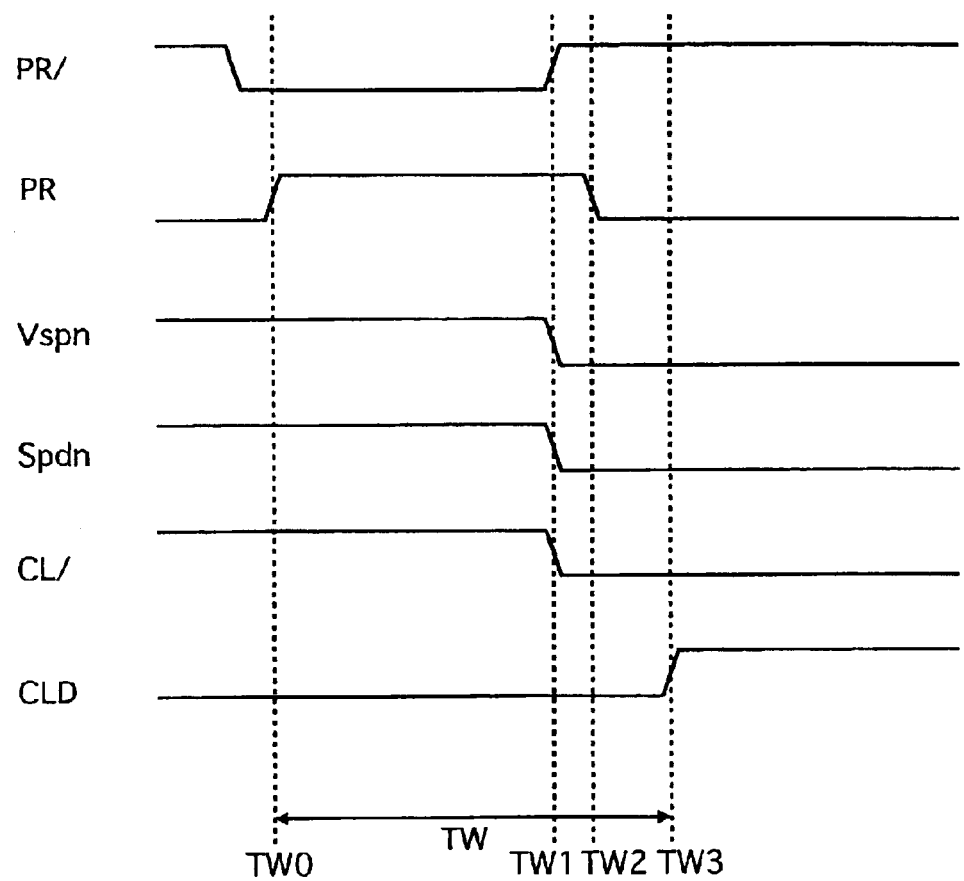
FIG. 7 is a timing chart, showing a detail of an operation at the time of switching from a reading-out period to an initializing period, which is a part of the timing chart of FIG. 6.

Note that TW in FIG. 7 represents a period from a rising of an inverted output signal (PR) of the inverter G10 to a rising of a boosted voltage to the boosted voltage output line 30a; TW0 a time of a rising of the inverted output signal (PR) of the inverter G10; TW1 a time of the rising of a clock pulse inputting to the input end (PR/) of the precharge circuit 123 and a drop of a clock pulse inputting to the input terminal (CL/) of the clock generating circuit 121; TW2 a time of a drop of the inverted output signal (PR) of the inverter G10; TW3 a time of a rising of boosted voltage to the boosted voltage output line 30a.

As shown in FIG. 7, the clock pulse of L is inputted to the input end (PR/) of the precharge circuit 123 of the voltage boost scanning circuit 108. Accompanying with this, the inverted output signal (PR) of the inverter G10 rises to H from L at the time of TW0. On the other hand, a clock pulse from the input terminal (PR/) rises to H, and accompanying with this, the inverted output (PR) of the inverter G10 drops at the time of TW2 delaying from TW1. Moreover, a voltage of the clock pulse inputted to the input end (CL/) of the clock generating circuit 121 is switched from H to L at the time of TW1 corresponding to a rising of the clock pulse from the input terminal (PR/). Thus, the transistor T3 is turned off to cut the drain electrode 22 of the MOS transistor 112 off from the VDD supply line 22a. The transistor T2 is already turned off because the H of the clock pulse (VSCNn) is inputted, and further the transistor T1 is turned off by a drop of the clock pulse inputting to the input terminal (CL/) to cut the gate electrode 19 of the MOS transistor 112 off from the VSCAN supply line 21a.

On the other hand, the transistor T4 is on by a rising of the clock pulse from the input terminal (CL/) of the clock generating circuit 121 between TW0 and TW1, and a voltage of 3.3 V is charged to the capacitance C2.

The inverter side end of the capacitance C2 is elevated at a voltage of 3.3 V by a drop of the clock pulse from the input terminal (CL/), and the transistor T5 is turned on to connect the boosted voltage output line 30a with the HSCAN supply line 20a. Further, the transistor T6 is turned off corresponding to a drop of the inverted output signal (PR) of the inverter G10 of the precharge circuit 123 to cut the HSCAN supply line 20a off from the precharge circuit 123. Thus, a voltage of 6.6 V appears in the HSCAN supply line 20a.

Moreover, since a voltage of the source becomes 6.6 V because the gate electrode 19 is cut off from the VSCAN supply line 21a, a potential of the gate electrode 19 through the capacitance between the source and the gate becomes 8.6 V in addition to a voltage of 2 V already discharged thereto.

Thus, a voltage applied to the source electrode 20 and the gate electrode 19 is applied to the second well region 15b and the epitaxial layer 12 therebelow. A high electric field generated at this time enables the carriers to be swept out of the second well region 15b accurately. Thus, the carriers can be swept out accurately with a low control voltage from the control circuit by providing the voltage boost circuit 122.

As described above, according to the second embodiment of the present invention, the voltage boost circuit 122 is connected to the source region of the MOS transistor 112 for optical signal detection, thus even if the power supply voltage of the control circuit is low, the carriers can be swept out more accurately.

Thus, the control circuit provided with the CMOS circuit maintains a lower voltage while the initialization is performed more perfectly.

The second embodiment of the present invention has been described above. It should be understood, however, that the scope of the present invention is not limited to the specific examples of the second embodiment, and changes and modifications of the embodiment without departing from the spirit of the present invention are all within the scope of the present invention.

For example, in the second embodiment, the method for driving the solid state imaging device is applied to the circuit as shown in FIG. 4B among the signal output circuits 108, it is applied to the circuit as shown in FIG. 4A (Third embodiment)

Next, a method for driving the solid state imaging device of a third embodiment of the present invention will be described with reference to the accompanying drawings.

Figure 8:
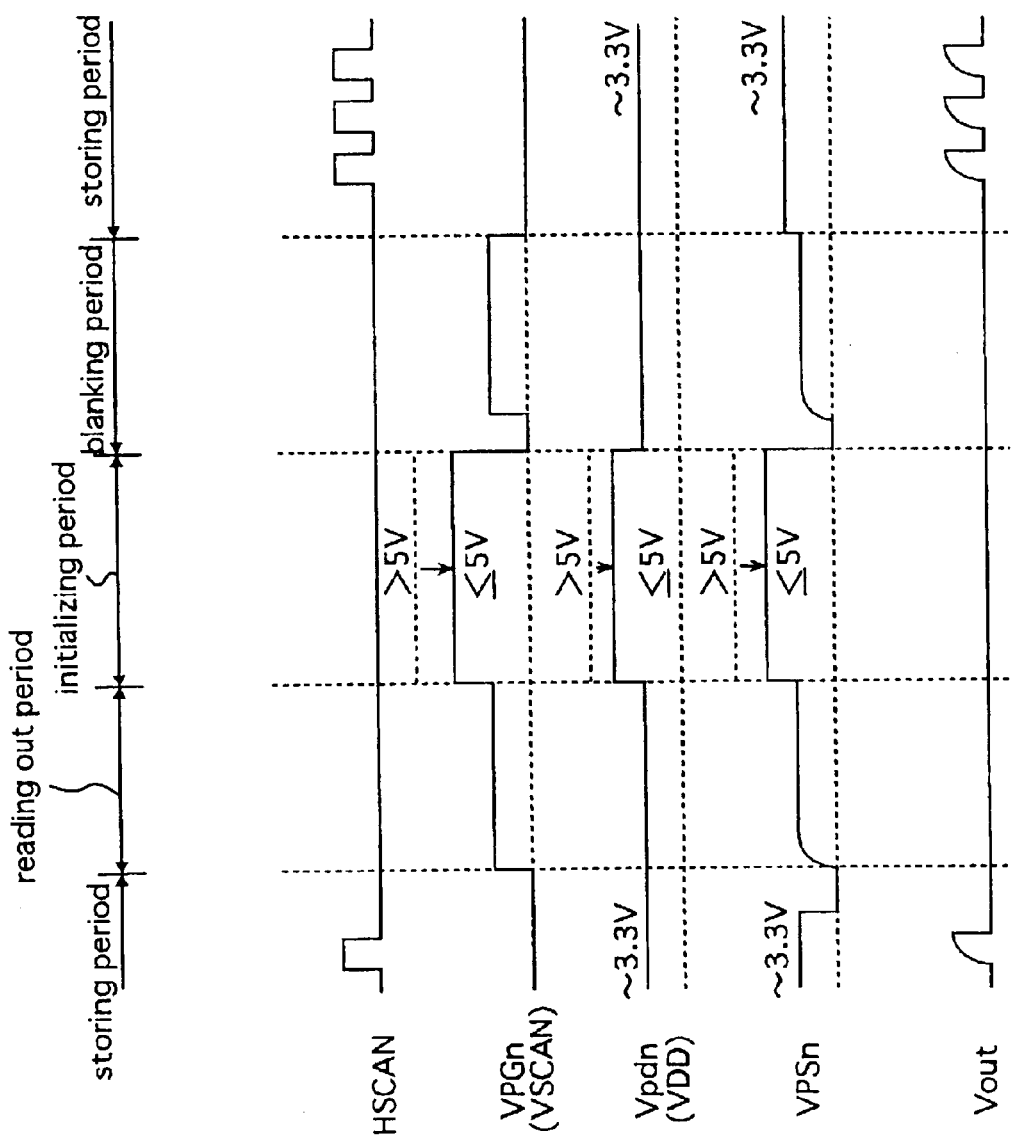
FIG. 8 is a timing chart showing a driving method of a solid state imaging device according to the third embodiment of the present invention.

FIG. 8 shows a timing chart of the input/output signals for operating the MOS image sensor according to the present invention.

The driving method of the solid state imaging device according to a third embodiment is applied to the solid state imaging device of the first embodiment, and a signal output circuit as shown in FIG. 4 is used. Moreover, a blanking period is added between the initialized period and the storing period.

In other words, the photodetecting operation is carried out by repeating, as described above, a series of periods including storing, reading-out, and sweeping (initializing), blanking.

During reading-out period, the first source potential modulated by a light signal is memorized in the first line memory while during the blanking period, the second source potential in a state of initializing the carrier pocket 25 is memorized in the second line memory. Further, during the storing period, a differential voltage between the first source potential and the second source potential which respectively are memorized in the first and second line memories during the previous period is outputted.

Herein, description will be made from the storing period for a convenience.

First, during the storing period, voltages (Vpdn, VPSn) of 3.3 V are applied to the drain regions 17a and 17b and the source region 16 of the MOS transistor 112 for optical signal detection, and the gate electrode 19 is grounded (VPGn).

At this time, the first well region 15a, the second well region 15b and the epitaxial layer 12 are depleted. And, in the first and second well regions 15a and 15b, an electric field toward the high-density buried layer (carrier pocket) 25 is generated due to a difference of an impurity density between the high-density buried layer 25 and the well regions 15a and 15b in the peripheral portion thereof.

Subsequently, the photo diode 111 is irradiated with a light to generate an electron and hole pair (optically generated charges).

The foregoing electric field causes optically generated holes among the optically generated charges to be injected into the gate region 15b of the MOS transistor 112 for optical signal detection, and to be stored in the carrier pocket 25. Accordingly, a limitation is placed on the width of the depletion layer spread from the channel region to the gate region 15b therebelow, a potential near the source region 16 is modulated, and the threshold voltage of the MOS transistor 112 is changed.

Figure 10A:
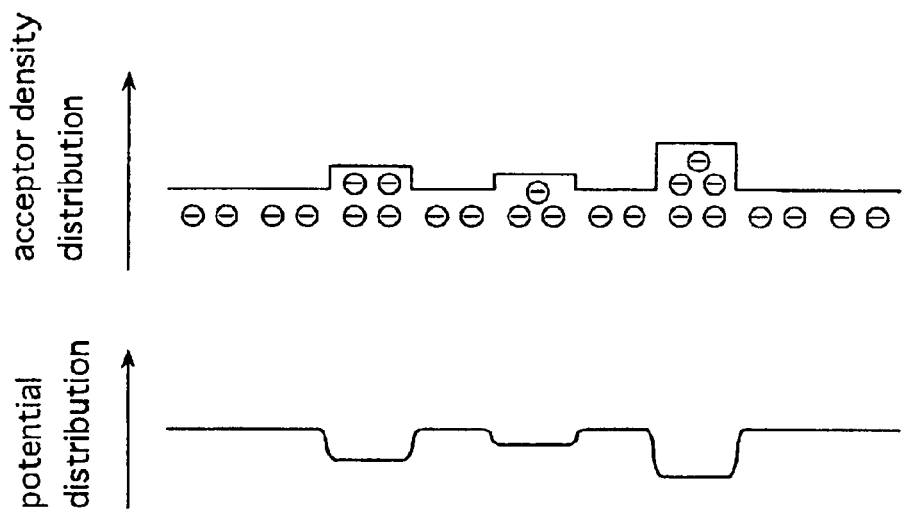
FIG. 10A is a view showing an acceptor density distribution and a potential distribution corresponding thereto in the carrier pocket, which is along the carrier pocket of the MOS transistor for light detection, in the case of perfectly sweeping holes from the carrier pocket during the initializing period of the driving method of the solid state imaging device according to the third embodiment of the present invention.
Figure 10B:
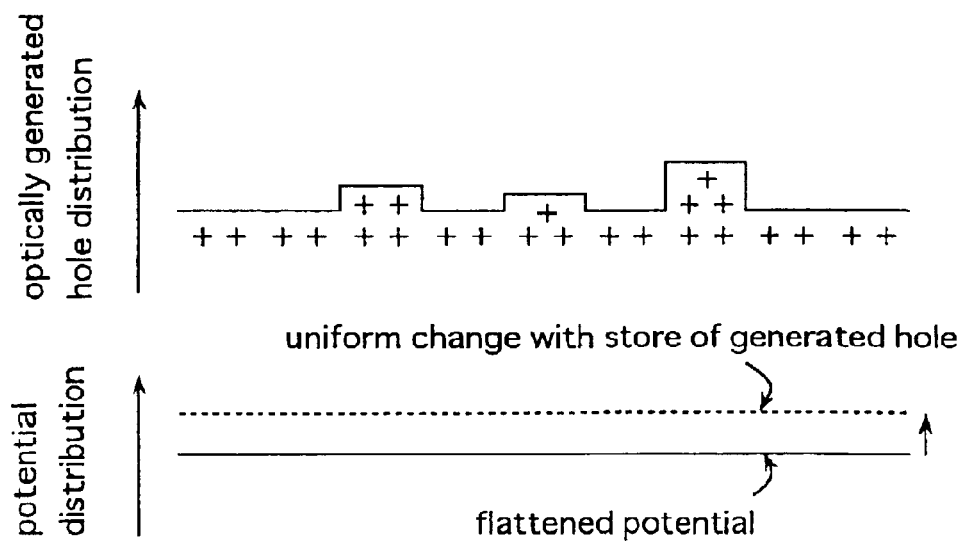
FIG. 10B is a view showing a potential distribution in the carrier pocket in the case where the appropriate amount of holes is remained in the carrier pocket similarly.

At this time, in the case where the acceptor density is varied in the carrier pocket 25, if the all of the optically generated charges are swept out during the initializing period to be described later, unevenness of the potential occurs corresponding to the variation of the acceptor density as shown in FIG. 10A. Therefore, while an injection amount of the holes is small, the holes are partialized and stored in a place where a potential is low. Thus, a black batter of the image occurs when the optical signal is read out. On the other hand, in the third embodiment of the present invention, the optically generated charges in an amount enough to flatten a potential distribution in the carrier pocket 25 are remained during the just previous initializing period as shown in FIG. 10B. Accordingly, in the case where the optically generated charges are stored further from such a state, the modulation of the threshold voltage becomes even over the entire channel region. Therefore, the occurrence of a so-called black batter can be prevented when the optical signal is read out.

Next, during the termination period of the storing period, the output (VPGn) of the VSCAN driving scanning circuit 102 is maintained at a ground potential to drive the gate of the MOS transistor 112 while driving the source at a ground potential. On the other hand, the VDD driving scanning line 22a is maintained at a voltage of about 3.3 V. Thus, the transfer of the optically generated charges to the carrier pocket 25 is accelerated by lowering a potential of the gate electrode 19 to more perfectly store the optically generated charges. At the same time, the first switch CK1 of the signal output circuit 105 is turned on.

Note that, during the storing period, a voltage of a difference between the source potentials stored in the first line memories Lms and the second line memories Lmn during the previous period is outputted to the video signal output terminal 107. This outputting operation will be described after the description for the blanking period.

Next, during the reading-out period, the output (VPGn) of the VSCAN driving scanning circuit 102 is set at a voltage of about 2.2 V to drive the gate of the MOS transistor 112 in a state of maintaining an on state of the first switch CK1 of the signal output circuit 105. On the other hand, the VDD driving scanning line 22a is maintained at a voltage of about 3.3 V to drive the drain of the MOS transistor 112.

In other words, a gate voltage of about 2 to 3 V is applied to the gate electrode 19 and voltages VDD of about 3.3 V are applied to the drain regions 17a and 17b to enable the MOS transistor 112 to operate in a saturated state. Thus, an inversion region of a low electric field is formed in a part of the channel region above the carrier pocket 25, and a high electric field region is formed in a remaining portion thereof. Thus, the MOS transistor is turned on to charge the first line memory.

Thus, the first line memory Lms is gradually charged. And as the charging goes on, the source potential comes to rise. When the source potential comes to be equal to the threshold voltage, the drain current stops flowing. Thus, the charging is completed, and the threshold voltage (source potential Vouts) optically modulated by the first line memory Lms is stored. This threshold voltage includes not only the voltage caused only by the optically generated charges but also a voltage (i.e., referred to as a noise voltage (Voutn)) caused by charges which are not the optically generated charges and contain charges being remained at an adequate volume during the previous initializing operation.

After the termination of the reading-out period, the first switch CK1 is turned off.

Next, description will be made for the initializing operation. In the initializing operation, the charges remaining in the carrier pocket 25 and the first and second well regions 15a and 15b are discharged.

To perform it, the boosted voltage is applied to the gate electrode 19 through the source region 16. The boosted voltage applied to the gate electrode 19 is applied to the second well region 15b and the epitaxial layer 12 therebelow. A potential distribution in the depth direction along the line II—II of FIG. 9A is shown by a solid line of FIG. 9B, and a potential distribution in and along the ring-shaped carrier pocket 25 are shown in FIG. 10A.

Figure 9A:
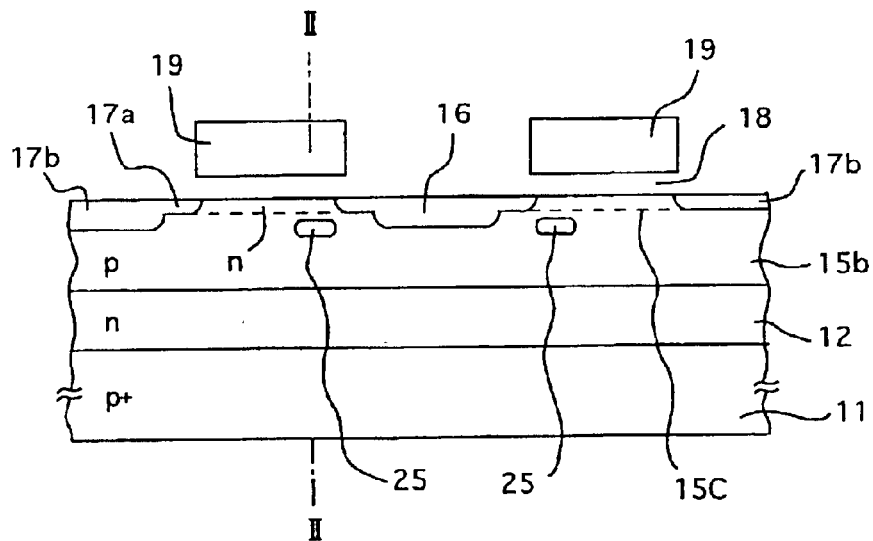
FIG. 9A is an element cross-sectional view showing the driving method of the solid state imaging device according to the third embodiment of the present invention.
Figure 9B:
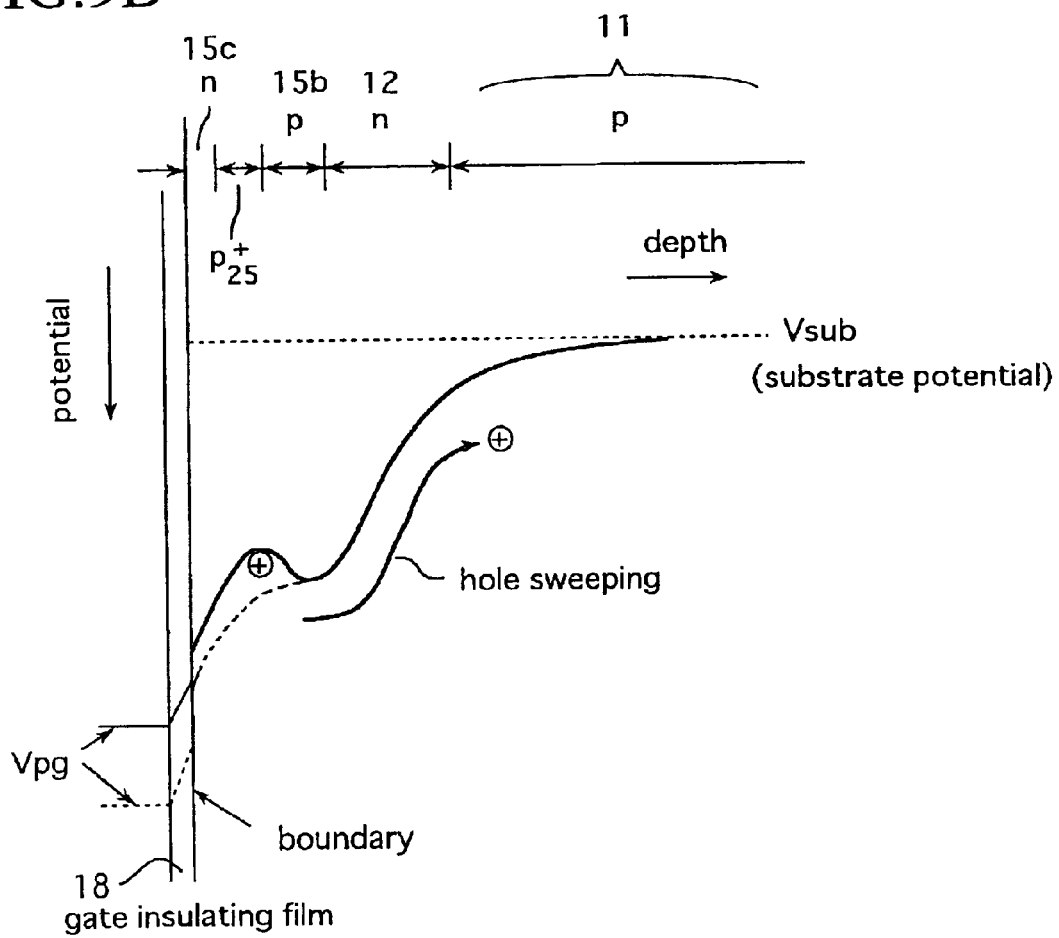
FIG. 9B is a view showing a potential distribution which can be seen through a carrier pocket of a MOS transistor for light detection in a depth direction, that is, along a line II—II in FIG. 9A, during an initializing period of the driving method of the solid state imaging device according to the third embodiment of the present invention.

In other words, an appropriate boosted voltage as shown by a solid line of FIG. 8 is applied to the gate electrode 19, thus a potential well of the carrier pocket 25 is made to be shallow and to keep an appropriate depth as shown by the solid line of FIG. 9B. Most of the optically generated charges are discharged while only the optically generated charges of a specified amount, which flatten a potential distribution in the carrier pocket 25, are made to remain as shown in FIG. 10B.

Figure 10C:
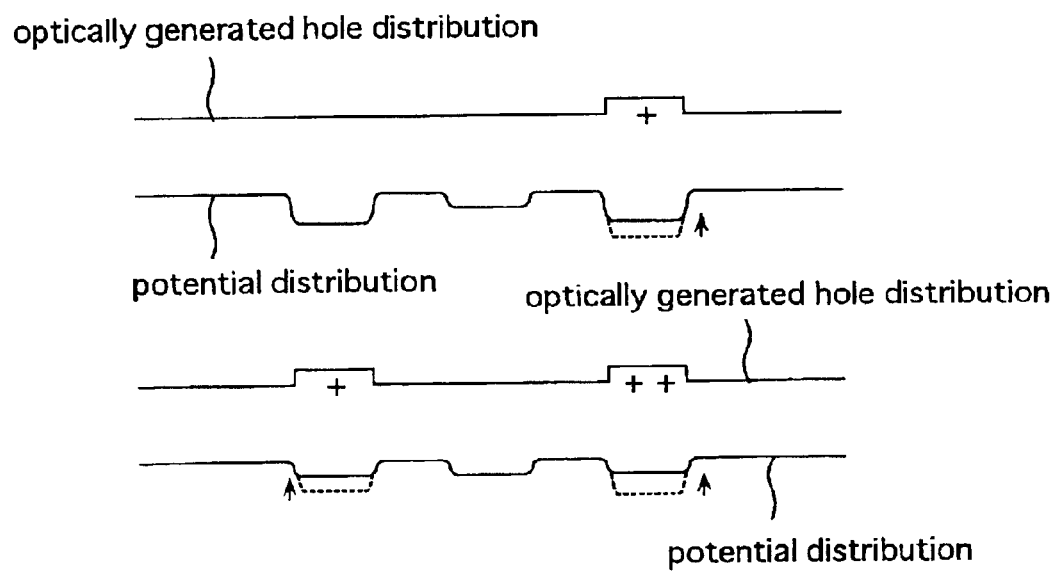
FIG. 10C is a view showing a state where the potential distribution in the carrier pocket is changed according to a stored amount of holes in the carrier pocket.

Note that, for comparison, the potential distribution in the depth direction along the line II—II of FIG. 9A in the case where the carries in the carrier pocket 25 are tried to be completely discharged without remaining therein are shown by a dotted line of FIG. 9B, and the potential distribution in the carrier pocket 25 in and along the ring-shaped carrier pocket 25 when the carrier pocket 25 is vacated as a result of the above is shown in FIG. 10A. A higher voltage as shown by the dotted line of FIG. 8 is applied to the gate electrode 19, thus a potential well in the carrier pocket 25 disappears as shown by the dotted line of FIG. 9B, and the optically generated charges are completely discharged. In this case, during the storing period, as shown in FIG. 10C, the deviation of the potentials occurs in the carrier pocket 25. Accordingly, the optically generated charges are partialized sequentially from a place where the potential is low, and stored.

The optically generated charges stored in the carrier pocket 25 are discharged while remaining a specified amount thereof which flattens a potential distribution in the carrier pocket 25. Thereafter, during an initial period of the blanking period, the output (VPGn) of the VSCAN driving canning circuit 102 is set at a ground potential to drive the gate of the MOS transistor 112. At the same time, the output (Vpdn) of the VDD driving scanning circuit 103 is set at a voltage of 3.3 V to drive the drain of the MOS transistor 112. Moreover, the third switch CK3 is turned on, and the second line memory Lmn is connected to the source region of the MOS transistor 112.

Next, during the period after the initial period of the blanking period, the output (VPGn) of the VSCAN driving scanning circuit 102 is set at a voltage of about 2.2 V to drive the gate of the MOS transistor 112. On the other hand, the VDD driving scanning line 22a is maintained at a voltage of about 3.3 V to drive the drain thereof.

Thus, an inversion region of a low electric field is formed in a part of the channel region above the carrier pocket 25, and a high electric field region is formed in the rest portion of the channel region. At this time, the MOS transistor 112 is turned on to charge the second line memory Lmn. As the charging goes on, the source potential comes to rise. When the source potential comes to be equal to the threshold voltage, the MOS transistor 112 is turned off. Thus, the charging is completed, and the noise voltage caused by the remaining charges, which are not caused by the optically generated charges, is stored in the second line memory Lmn.

After termination of the blanking period, the switch CK2 is turned off.

Next, the operation returns to the storing period. At this time, the storing operation is performed, and the operation for outputting a voltage of a difference between the source potentials Vouts and Voutn which are stored in the first and second line memories Lms and Lmn during the previous period. In such a way, the video signal (Vout=Vouts−Voutn) proportional to the light irradiation amount can be taken out.

As described above, according to the third embodiment of the present invention, during the initializing period, as shown by the solid line of FIG. 9B, an appropriate high voltage is applied to the gate electrode 19, thus the potential well of the carrier pocket 25 is made shallow, but deep appropriately. In other words, most of the optically generated charges are discharged while only a specified amount of the optically generated charges which flattens a potential distribution in the carrier pocket 25 are made to remain. Accordingly, in the case where the optically generated charges are further stored from such a state, the modulation of the threshold voltage becomes even over the entire channel region. Accordingly, when the optical signal is read out, a so-called black batter of the image can be prevented.

Moreover, in a series of operations of storing-reading-out-sweeping (initializing)-blanking, it is possible to realize an ideal photoelectric conversion mechanism capable of preventing interaction with a noise source on the semiconductor surface or in the channel region when optically generated holes are moved.

The third embodiment of the present invention has been described in detail. However, the scope of the present invention is not limited to the specific examples in the third embodiment, and changes and modifications of the embodiment without departing from the spirit of the present invention are within the scope of the, present invention.

For example, in the third embodiment, during the initializing period, an appropriate high voltage for discharging most of the optically generated charges while remaining a specified amount thereof changes depending on the element parameter such as a thickness of the gate insulating film 18 and a density of the carrier pocket 25. Accordingly, the voltage is appropriately varied depending on element parameters to be set.

Moreover, though the present invention is applied to the solid state imaging device having the voltage boost scanning circuit 108 as shown in FIG. 5, the present invention may also be applied to the solid state imaging device without the voltage boost scanning circuit 108.

What is claimed is:

1. A driving method of a solid state imaging device comprising the steps of:
   (i) preparing solid state imaging device comprising
       (a) a unit pixel provided with
           (1) a photo diode, and
           (2) an insulated gate field effect transistor for optical signal detection being placed adjacently to the photo diode and being provided with a high-density buried layer for storing optically generated charges generated in the photo diode, the high-density buried layer being provided in the vicinity of a source region within a well region below a gate electrode;
       (b) a vertical scanning signal driving scanning circuit for outputting a scanning signal to the gate electrode, and
       (c) a voltage boost scanning circuit for outputting a boosted voltage to the source region;
   (ii) irradiating light into the photo diode to generate the optically generated charges in the well region;
   (iii) transferring the optically generated charges to the high-density buried layer to store the optically generated charges in the high-density buried layer;
   (iv) detecting a changing amount of a threshold voltage, which is changed with an amount of the stored optically generated charges, of the insulated gate field effect transistor;
   (v) outputting the boosted voltage from the voltage boost scanning circuit;
   (vi) applying the boosted voltage to the source region of the insulated gate field effect transistor in a state where the gate electrode is cut off from the vertical scanning signal supply line, thereby the boosted voltage is applied to the gate electrode through a capacitance between the source region and the gate electrode;
   (vii) sweeping out the optically generated charges stored in the high-density buried layer by a source voltage and a gate voltage raised by the boasted voltage; and
   (viii) repeating the steps of (ii) to (vii).

2. A driving method of a solid state imaging device comprising the steps of:
   (i) preparing a solid state imaging device comprising:
       (a) a unit pixel provided with
           (1) a photo diode, and
           (2) an insulated gate field effect transistor for optical signal detection being placed adjacent to the photo diode and being provided with a well region of a flint conductivity type, a source region of a second conductivity type formed on a surface layer of the well region, a drain region of a second conductivity type formed on a surface layer of the well region, a channel region between the source region and the drain region, a gate electrode formed on a gate insulation film on the channel region, and a high-density buried layer of the first conductivity type for storing optically generated charges generated in the photo diode, the high-density buried layer being provided within a well region below a gate electrode,
       (b) a drain voltage driving scanning circuit for supplying a drain voltage to the drain region, (c) a vertical scanning signal driving scanning circuit for outputting a scanning signal to the gate electrode, and (d) a voltage boost scanning circuit for outputting a boosted voltage to the source region;

(ii) irradiating light into the photo diode to generate the optically generated charges in the well region;

(iii) transferring the optically generated charges to the high-density buried layer to store the optically generated charges in the high-density buried layer;

(iv) detecting a changing amount of a threshold voltage, which is changed with an amount of the stored optically generated charges, of the insulated gate field effect transistor;

(v) outputting the boosted voltage from the voltage boost scanning circuit;

(vi) applying the boosted voltage to the source region of the insulated gate field effect transistor in a state where the gate electrode is cut off from the vertical scanning signal supply line, whereby the boosted voltage is applied to the gate electrode through a capacitance between the source region and the gate electrode; and (vii) sweeping out the optically generated charges stored in the high-density buried layer by a source voltage and a gate voltage raised by the boosted voltage; and (viii) repeating the steps of (ii) to (vii).

* * * * *